(12) United States Patent
Fumitake

(10) Patent No.: US 8,748,260 B2
(45) Date of Patent: Jun. 10, 2014

(54) METHOD FOR MANUFACTURING NANO-CRYSTALLINE SILICON MATERIAL FOR SEMICONDUCTOR INTEGRATED CIRCUITS

(75) Inventor: Mieno Fumitake, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 12/704,495

(22) Filed: Feb. 11, 2010

(65) Prior Publication Data

US 2011/0045661 A1 Feb. 24, 2011

(30) Foreign Application Priority Data

Aug. 20, 2009 (CN) .......................... 2009 1 0056733

(51) Int. Cl.
    *H01L 21/336* (2006.01)
(52) U.S. Cl.
    USPC ....................................................... 438/258
(58) Field of Classification Search
    None
    See application file for complete search history.

(56) References Cited

U.S. PATENT DOCUMENTS

| | | | | |
|---|---|---|---|---|
| 6,093,243 A * | 7/2000 | Okada et al. | ................ | 117/8 |
| 6,207,502 B1 * | 3/2001 | Au et al. | ................ | 438/258 |
| 2003/0008458 A1 * | 1/2003 | Hashimoto et al. | ........... | 438/258 |
| 2004/0104426 A1 * | 6/2004 | Forbes et al. | ................ | 257/325 |
| 2004/0197943 A1 * | 10/2004 | Izumi et al. | ................ | 438/22 |
| 2005/0218460 A1 * | 10/2005 | Hasegawa et al. | ........... | 257/390 |
| 2006/0223333 A1 * | 10/2006 | Li et al. | ................ | 438/762 |
| 2006/0278580 A1 * | 12/2006 | Striemer et al. | ............. | 210/650 |
| 2007/0123004 A1 * | 5/2007 | Takahashi et al. | ........... | 438/478 |
| 2008/0000521 A1 * | 1/2008 | Sivoththaman et al. | ...... | 136/254 |
| 2009/0161438 A1 * | 6/2009 | Sandhu et al. | .......... | 365/185.18 |
| 2009/0272423 A1 * | 11/2009 | Niira et al. | ................ | 136/244 |
| 2010/0032643 A1 * | 2/2010 | Xu | ................ | 257/4 |

\* cited by examiner

*Primary Examiner* — Charles Garber
*Assistant Examiner* — Andre' C Stevenson
(74) *Attorney, Agent, or Firm* — Kilpatrick Townsend & Stockton LLP

(57) ABSTRACT

A method for forming a nanocrystalline silicon structure for the manufacture of integrated circuit devices, e.g., memory, dynamic random access memory, flash memory, read only memory, microprocessors, digital signal processors, application specific integrated circuits. In a specific embodiment, the present invention includes providing a semiconductor substrate including a surface region. The method includes forming an insulating layer (e.g., silicon dioxide, silicon nitride, silicon oxynitride) overlying the surface region according to a specific embodiment. The method includes forming an amorphous silicon material of a determined thickness of less than twenty nanometers overlying the insulating layer. The method includes subjecting the amorphous silicon material to a thermal treatment process to cause formation of a plurality of nanocrystalline silicon structures derived from the thickness of amorphous silicon material less than twenty nanometers.

9 Claims, 5 Drawing Sheets

Relationship between a-Si layer thickness and nano-crystalline Si size

| a-Si layer thickness | 1 nm | 2 nm | 3 nm | 4 nm | 5 nm | 10 nm |
|---|---|---|---|---|---|---|
| Nano-crystalline Si size | - | 1.8 nm | 2.7 nm | 3.8 nm | 4.6 nm | 9.5 nm |

(Measured using TEM. 1 nm case is difficult to measure by TEM)

Figure 7

METHOD FOR MANUFACTURING NANO-CRYSTALLINE SILICON MATERIAL FOR SEMICONDUCTOR INTEGRATED CIRCUITS

CROSS-REFERENCES TO RELATED APPLICATIONS

This application claims priority to Chinese Application No. 200910056733.6 filed on Aug. 20, 2009, commonly assigned, incorporated by reference herein for all purposes.

BACKGROUND OF THE INVENTION

The present invention is directed to integrated circuits and their processing for the manufacture of semiconductor devices. More particularly, the invention provides a method for manufacturing nano-sized silicon material on a film of dielectric material for manufacture of semiconductor integrated circuits. But it would be recognized that the invention has a much broader range of applicability. That is, the invention can have applicability to flat panel displays, micro-electrical mechanical systems, commonly called MEMS, nano-devices, and others.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus, increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of a process that has limitations based upon a given feature size is the formation of silicon materials for capacitor structures for dynamic random access memory devices. Such memory devices are often formed for devices having a design rule of 90 nanometers and less. The silicon materials, including polysilicon, are often formed for electrodes of capacitor structures of these memory devices. Unfortunately, it is often difficult to form high quality nano-sized silicon structures using conventional technologies. That is, difficulties arise in making each of these dielectric materials as device sizes decrease. These and other limitations of conventional dielectric structures can be found throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method for manufacturing nano-sized silicon material on a film of dielectric material for manufacture of semiconductor integrated circuits. But it would be recognized that the invention has a much broader range of applicability. That is, the invention can have applicability to flat panel displays, micro-electrical mechanical systems, commonly called MEMS, nano-devices, and others.

In a specific embodiment, the present invention provides a method for forming a nanocrystalline silicon structure for the manufacture of integrated circuit devices, e.g., memory, dynamic random access memory, flash memory, read only memory, microprocessors, digital signal processors, application specific integrated circuits. In a specific embodiment, the present invention includes providing a semiconductor substrate including a surface region. The method includes forming an insulating layer (e.g., silicon dioxide, silicon nitride, silicon oxynitride) overlying the surface region according to a specific embodiment. The method includes forming an amorphous silicon material of a determined thickness of less than twenty nanometers overlying the insulating layer. The method includes subjecting the amorphous silicon material to a thermal treatment process to cause formation of a plurality of nanocrystalline silicon structures derived from the thickness of amorphous silicon material less than twenty nanometers.

In an alternative specific embodiment, the present invention provides a method for forming a nanocrystalline silicon structure for the manufacture of integrated circuit devices, e.g., memory, dynamic random access memory, flash memory, read only memory, microprocessors, digital signal processors, application specific integrated circuits. In a specific embodiment, the present invention includes forming semiconductor substrate including a surface region. The method includes forming an insulating layer (e.g., silicon dioxide, silicon nitride, silicon oxynitride) characterized by a high K dielectric constant overlying the surface region according to a specific embodiment. The method includes forming an amorphous silicon material of a determined thickness of less than twenty nanometers overlying the insulating layer. The method includes subjecting the amorphous silicon material to a thermal treatment process to cause formation of a plurality of nanocrystalline silicon structures derived from the thickness of amorphous silicon material less than twenty nanometers. In a preferred embodiment, the method includes maintaining a temperature of about 600 Degrees Celsius and less during a portion of time associated with forming the amorphous silicon material.

Many benefits are achieved by way of the present invention over conventional techniques. For example, the present technique provides an easy to use process that relies upon conventional technology. In some embodiments, the method can provide higher device yields in dies per wafer. Additionally, the method provides a process that is compatible with conventional process technology without substantial modifications to conventional equipment and processes. Preferably, the invention provides a way of forming nano-sized crystalline material using an amorphous silicon material and thermal treatment according to a specific embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 7 is a simplified diagram illustrating a relationship of amorphous silicon thickness and nanocrystalline silicon size according to an embodiment of the present invention.

DETAILED DESCRIPTION OF THE INVENTION

According to the present invention, techniques for processing integrated circuits for the manufacture of semiconductor devices are provided. More particularly, the invention provides a method for manufacturing nano-sized silicon material on a film of dielectric material for manufacture of semiconductor integrated circuits. But it would be recognized that the invention has a much broader range of applicability. That is, the invention can have applicability to flat panel displays, micro-electrical mechanical systems, commonly called MEMS, nano-devices, and others.

Figure 1:
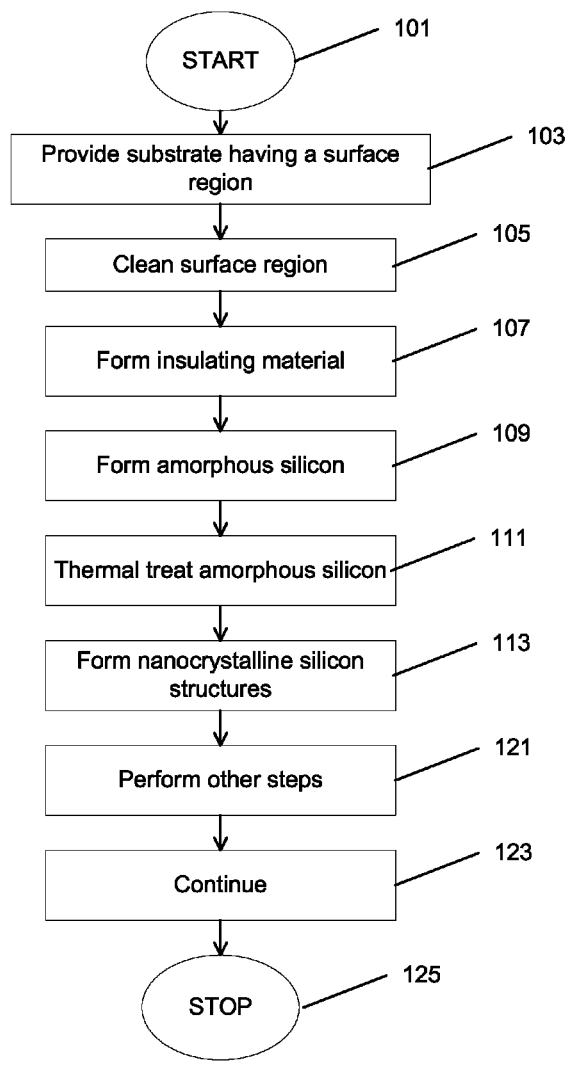
FIG. 1 is a simplified flow diagram of a method of forming a nanocrystalline material according to an embodiment of the present invention.

Referring to FIG. 1, a method for forming nano-crystalline sized silicon according to an embodiment of the present invention is outlined below.

1. Start, step 101;
2. Provide (step 103) a semiconductor substrate (e.g., silicon wafer, silicon on insulator) having a surface region, which has a native oxide layer;
3. Subject the surface region (step 105) to a wet cleaning process to remove a native oxide layer from the surface region;
4. Subject (step 107) the surface region to an oxidizing environment to form an insulating layer overlying the surface region;
5. Form (step 109) an amorphous silicon material of a determined thickness of less than twenty nanometers overlying the insulating layer;
6. Subject (step 111) the amorphous silicon material to a thermal treatment process;
7. Cause formation of a plurality of nanocrystalline silicon structures (step 113) derived from the thickness of amorphous silicon material less than twenty nanometers;
8. Perform other steps (step 121), as desired;
9. Continue (step 123) the other steps; and
10. Stop, step 125.

The above sequence of steps provides a method according to an embodiment of the present invention. As shown, the method uses a combination of steps including a way of forming an element for an integrated circuit device such as a dynamic random access memory, application specific integrated circuit, flash memory, digital signal processor, microprocessor, microcontroller, and others. As shown, the method includes using a thermal treatment process of an amorphous silicon material provided overlying an insulating layer according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

Figure 2:
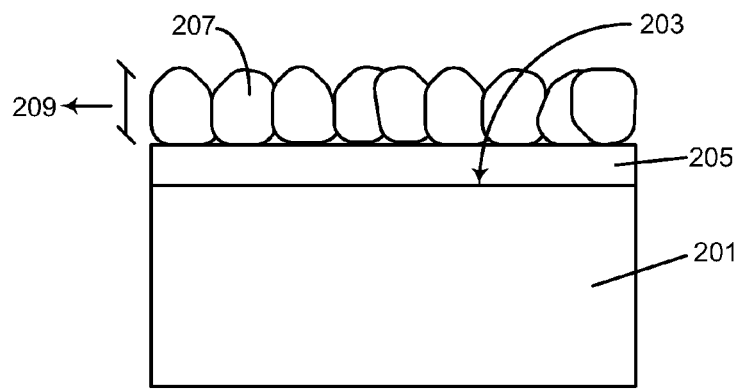
FIGS. 2 and 3 illustrate a simplified method of forming a nanocrystalline material according to an embodiment of the present invention.
Figure 3:
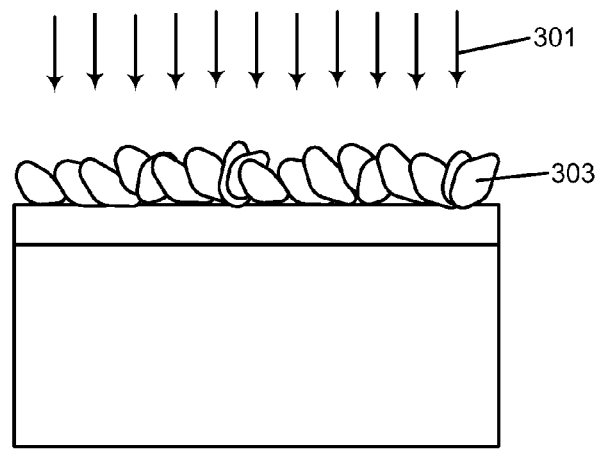

FIGS. 2 and 3 illustrate a simplified method of forming a nanocrystalline material according to an embodiment of the present invention. These diagrams are merely examples, which should not unduly limit the scope of the claims herein. One of ordinary skill in the art would recognize many variations, modifications, and alternatives. As shown, the method begins by providing a semiconductor substrate 201 having a surface region 203, which has a native oxide layer. The surface region can be planar, non-planar, and other shapes depending on the embodiment. In a specific embodiment, the substrate can be a silicon wafer, silicon on insulator, epitaxial wafer, and others. Of course, there can be other variations, modifications, and alternatives.

Referring again to FIG. 2, the method includes treating the surface region with a cleaning process. In a specific embodiment, the cleaning process is suitable to remove a native oxide layer from the surface region. In a specific embodiment, the method includes subjecting the surface region to an oxidizing environment to form an insulating layer 205 overlying the surface region. That is, the oxidizing environment can include an oxygen species and combinations of oxygen and nitrogen species, and nitrogen species, to form materials including silicon dioxide, silicon nitride, silicon oxynitride, and others. Of course, there can be other variations, modifications, and alternatives.

In a preferred embodiment, the present method forms a high K dielectric layer overlying the surface region. In a preferred embodiment, the high K dielectric reduces gate leakage while maintaining transistor performance. Again as an example, the dielectric constant of silicon dioxide, which is a commonly insulating material for semiconductor devices, is about 3.9 and less. In a specific embodiment, one or more oxide-nitride-oxide (ONO) stacks can be provided to increase the dielectric constant. Alternatively, the high K dielectric may include a suitable oxide (e.g., $ZrO_2$, $HfO_2$) or compound (e.g., BST, $Ba_xSr_{1-x}TiO_3$) according to a specific embodiment. Of course, there can be other variations, modifications, and alternatives.

In a specific embodiment, the method includes forming an amorphous silicon material 207 of a determined thickness 209 of less than twenty nanometers overlying the insulating layer. In a specific embodiment, the determined thickness can be any suitable thickness that relates to the final size of the nano-sized crystalline structures. In a specific embodiment, the amorphous silicon is provided using one or more suitable species in a predetermined environment. The one or more species can include a $SiH_4$ gas, a $Si_2H_6$ gas, a $Si_3H_4$ gas, or others provided using chemical vapor deposition. In a specific embodiment, the chemical vapor deposition can include low pressure chemical vapor deposition, plasma enhanced chemical vapor deposition, and others. In a specific embodiment, the amorphous silicon layer is provided by a sputtering process. In one or more embodiments, the amorphous silicon is maintained under a vacuum environment. In a specific embodiment, the amorphous silicon material is provided at a temperature of less than about 600 Degrees Celsius or less than about 550 Degrees Celsius to cause the amorphous characteristic.

Referring to FIG. 3, the method includes subjecting the amorphous silicon material to a thermal treatment process 301 according to a specific embodiment. In a preferred embodiment, the thermal treatment process causes formation of a plurality of nanocrsytalline silicon structures 303 derived from the thickness of amorphous silicon material less than twenty nanometers. In a preferred embodiment, the nano crystalline silicon structures are characterized by a size that relates directly to the thickness of the amorphous silicon layer. In a specific embodiment, the thermal treatment is provided while the amorphous silicon is maintained in an inert environment, e.g., argon, nitrogen. In a specific embodiment, the thermal treatment is provided by a furnace, a rapid thermal anneal, or other suitable techniques. The thermal treatment is also provided at a temperature of greater than about 650 Degrees Celsius for a time period of less than ten minutes. Of course, there can be other variations, modifications, and alternatives.

The above sequence of steps provides a method according to an embodiment of the present invention. As shown, the method uses a combination of steps including a way of forming an element of an integrated circuit device such as a dynamic random access memory, application specific integrated circuit, flash memory, digital signal processor, microprocessor, microcontroller, and others. As shown, the method includes using a thermal treatment process of an amorphous silicon material provided overlying an insulating layer according to a specific embodiment. Other alternatives can also be provided where steps are added, one or more steps are removed, or one or more steps are provided in a different sequence without departing from the scope of the claims herein.

Figure 4:
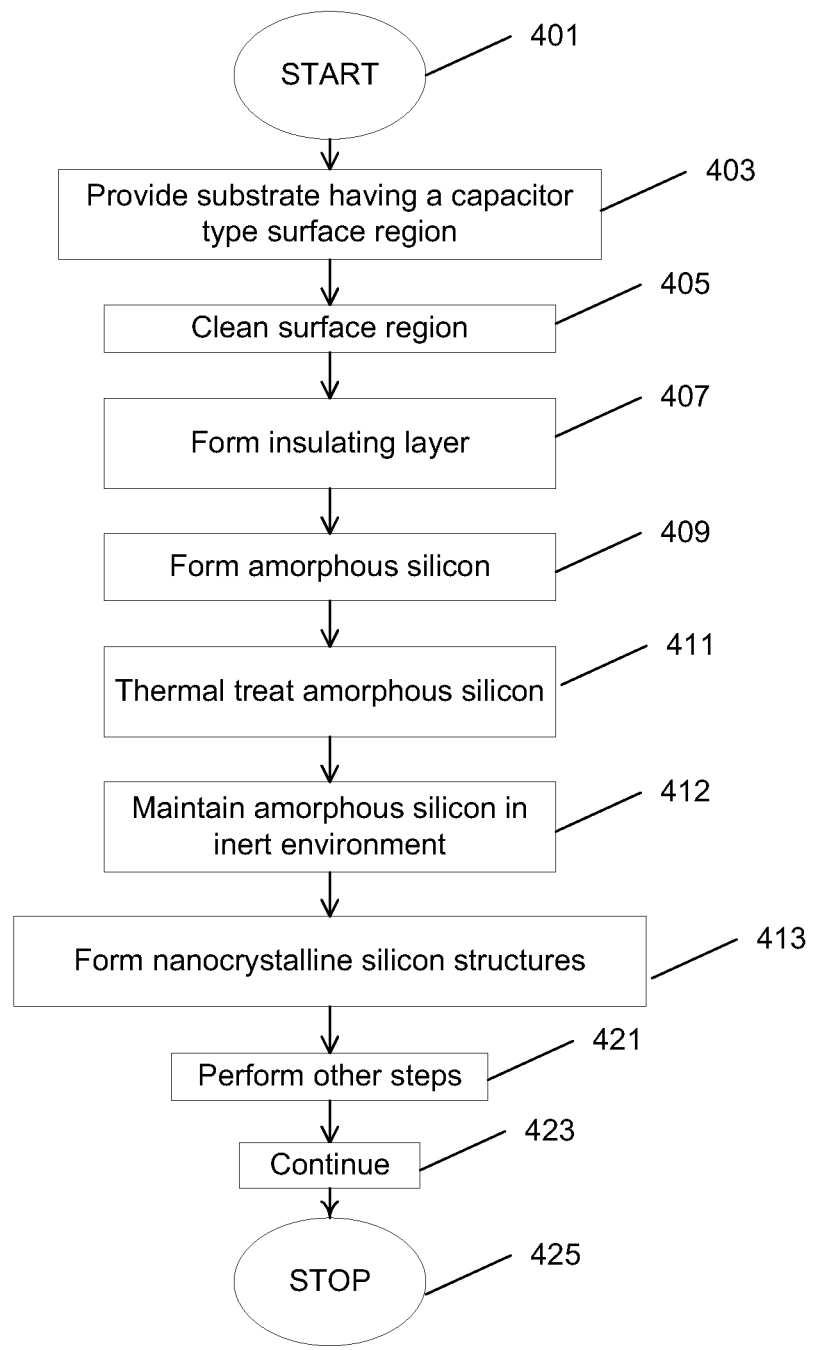
FIG. 4 is a simplified flow diagram of an alternative method of forming a capacitor structure using nanocrystalline silicon material according to an alternative embodiment of the present invention.

Referring to FIG. 4, embodiments of the present invention provides a method of forming nano-crystalline sized silicon for a capacitor structure, which is outlined below.

1. Start, step 401;
2. Provide (step 403) a semiconductor substrate having a capacitor type surface region, which has a native oxide layer;
3. Subject the surface region (step 405) to a wet cleaning process to remove a native oxide layer from the surface region;
4. Subject (step 407) the surface region to an oxidizing environment to form an insulating layer overlying the surface region;
5. Form (step 409) an amorphous silicon material of a determined thickness of less than twenty nanometers overlying the insulating layer;
6. Subject (step 411) the amorphous silicon material to a thermal treatment process;
7. Maintain (step 412) the amorphous silicon material in an inert environment, e.g., helium, or a reducing environment, e.g., hydrogen, hydrogen chloride, or combinations.
8. Cause formation of a plurality of nanocrystalline silicon structures (step 413) derived from the thickness of amorphous silicon material less than twenty nanometers;
9. Perform other steps (step 421), as desired;
10. Continue (step 423) the other steps; and
11. Stop, step 425.

The above sequence of steps provides a method for forming nanocrystalline silicon structures according to an embodiment of the present invention. As shown, the method uses a combination of steps including a way of forming an element of an integrated circuit device such as a dynamic random access memory, application specific integrated circuit, flash memory, digital signal processor, microprocessor, microcontroller, and others. As shown, the method includes using a thermal treatment process of an amorphous silicon material provided overlying an insulating layer according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

Figure 5:
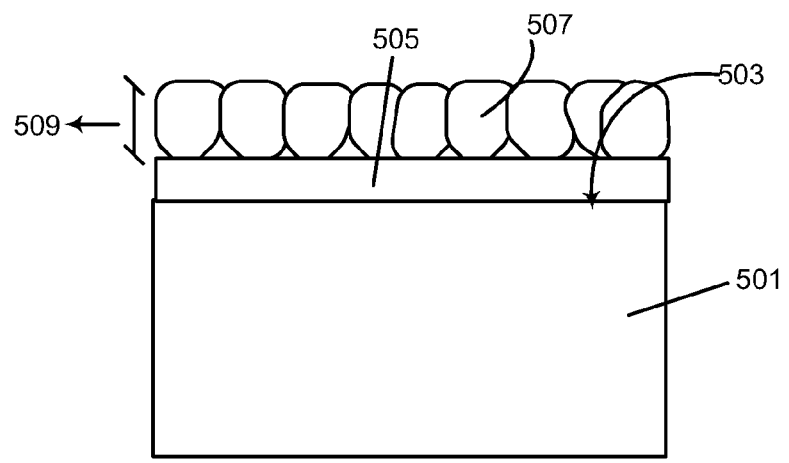
FIGS. 5 through 6 illustrate a simplified method of fabricating a capacitor structure for a memory device according to an embodiment of the present invention.
Figure 6:
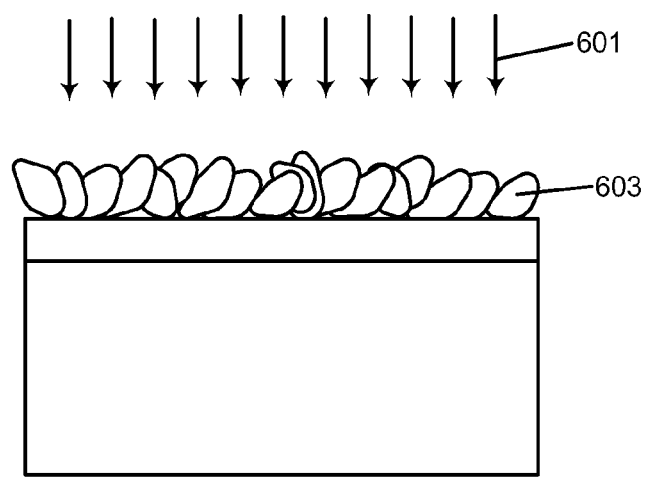

FIGS. 5 through 6 illustrate a simplified method of fabricating a capacitor structure for a memory device according to an embodiment of the present invention. These diagrams are merely examples, which should not unduly limit the scope of the claims herein. One of ordinary skill in the art would recognize many variations, modifications, and alternatives. As shown, the method begins by providing a semiconductor substrate 501 having a surface region 503, which has a native oxide layer. The surface region can be planar, non-planar, and other shapes depending on the embodiment. In a specific embodiment, the semiconductor substrate has a capacitor type surface region. In a specific embodiment, the substrate can be a silicon wafer, silicon on insulator, epitaxial wafer, and others. Of course, there can be other variations, modifications, and alternatives.

Referring again to FIG. 5, the method includes treating the surface region with a cleaning process. In a specific embodiment, the cleaning process is suitable to remove a native oxide layer from the surface region. In a specific embodiment, the method includes subjecting the surface region to an oxidizing environment to form an insulating layer 505 overlying the surface region. That is, the oxidizing environment can include an oxygen species and combinations of oxygen and nitrogen species, and nitrogen species, to form materials including silicon dioxide, silicon nitride, silicon oxynitride, and others. Of course, there can be other variations, modifications, and alternatives.

In a preferred embodiment, the present method forms a high K dielectric layer overlying the surface region. In a preferred embodiment, the high K dielectric reduces gate leakage while maintaining transistor performance. Again as an example, the dielectric constant of silicon dioxide, which is a commonly insulating material for semiconductor devices, is about 3.9 and less. In a specific embodiment, one or more oxide-nitride-oxide (ONO) stacks can be provided to increase the dielectric constant. Alternatively, the high K dielectric may include a suitable oxide (e.g., $ZrO_2$, $HfO_2$) or compound (e.g., BST, $Ba_xSr_{1-x}TiO_3$) according to a specific embodiment. Of course, there can be other variations, modifications, and alternatives.

In a specific embodiment, the method includes forming an amorphous silicon material 507 of a determined thickness 509 of less than twenty nanometers overlying the insulating layer. In a specific embodiment, the determined thickness can be any suitable thickness that relates to the final size of the nano-sized crystalline structures. In a specific embodiment, the amorphous silicon is provided using one or more suitable species in a predetermined environment. The one or more species can include a $SiH_4$ gas, a $Si_2H_6$ gas, a $Si_3H_4$ gas, or others provided using chemical vapor deposition. In a specific embodiment, the chemical vapor deposition can include low pressure chemical vapor deposition, plasma enhanced chemical vapor deposition, and others. In a specific embodiment, the amorphous silicon layer is provided by a sputtering process. In one or more embodiments, the amorphous silicon is maintained under a vacuum environment. In a specific embodiment, the amorphous silicon material is provided at a temperature of less than about 600 Degrees Celsius or less than about 550 Degrees Celsius to cause the amorphous characteristic.

Referring to FIG. 6, the method includes subjecting the amorphous silicon material to a thermal treatment process 601 according to a specific embodiment. In a preferred embodiment, the thermal treatment process causes formation of a plurality of nanocrystalline silicon structures 603 derived from the thickness of amorphous silicon material less than twenty nanometers. In a preferred embodiment, the nanocrystalline silicon structures are characterized by a size that relates directly to the thickness of the amorphous silicon layer. In a specific embodiment, the thermal treatment process is provided while the amorphous silicon is maintained in an inert environment, e.g., argon, nitrogen. In a specific embodiment, the thermal treatment is provided by a furnace, a rapid thermal anneal, or other suitable techniques. The thermal treatment is also provided at a temperature of greater than about 650 Degrees Celsius for a time period of less than ten minutes. Of course, there can be other variations, modifications, and alternatives.

The above sequence of steps provides a method according to an embodiment of the present invention. As shown, the method uses a combination of steps including a way of forming an element of an integrated circuit device such as a dynamic random access memory, application specific integrated circuit, flash memory, digital signal processor, microprocessor, microcontroller, and others. As shown, the method includes using a thermal treatment process of an amorphous silicon material provided overlying an insulating layer according to a specific embodiment. Other alternatives can also be provided where steps are added, one or more steps are removed, or one or more steps are provided in a different sequence without departing from the scope of the claims herein.

EXAMPLES

To prove the principle and operation of the present method, we performed experiments. These experiments are merely examples, which should not unduly limit the scope of the claims herein. One of ordinary skill in the art would recognize many variations, modifications, and alternatives. In the experiments, we used silicon substrates, such as silicon wafers. The silicon wafers included surfaces coated with silicon dioxide, which was high quality. That is, the silicon dioxide was free of any voids, etc. The silicon wafers were subjected to oxidation. A deposition of about 2 nanometers of amorphous silicon was provided on the surface of the silicon dioxide according to a specific embodiment. The amorphous silicon was provided using the following conditions:

Gas: 1% $Si_2H_6$ in argon gas at 20 SCCMs;
Pressure: 0.1 Torr;
Temperature: 450 Degrees Celsius; and
Deposition Rate: 0.5 Angstroms/minute.

Once the amorphous silicon has been deposited, the experiment subjected the amorphous silicon to a thermal treatment process. The thermal treatment process was provided at a temperature of about 900 Degrees Celsius for a time of about 1 minute. The thermal treatment process was carried out in an inert environment of helium gas, but it is believed that other gases may also be used. The helium gas was provided at about 1 standard liters per minute. A relationship between the thickness of the amorphous silicon layer and nanocrystalline silicon size is provided by FIG. 7. As shown, the amorphous silicon layer thickness determines the size of the nanocrystalline silicon. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a nanocrystalline silicon structure for the manufacture of integrated circuit devices, the method comprising:
    providing a semiconductor substrate including a surface region;
    forming an insulating layer characterized by a high K dielectric constant overlying the surface region;
    forming an amorphous silicon layer of a determined thickness of less than twenty nanometers overlying the insulating layer using $Si_3H_4$;
    maintaining a temperature of about 600 degrees Celsius and less during a portion of time associated with forming the amorphous silicon material;
    subjecting the amorphous silicon layer to a thermal treatment process to cause formation of a plurality of nanocrystalline silicon structures derived from the thickness of the amorphous silicon layer less than twenty nanometers while maintaining the amorphous silicon layer in an inert environment.

2. The method of claim 1 wherein the amorphous silicon layer is provided by a silane gas.

3. The method of claim 1 wherein the amorphous silicon layer is provided by a $SiH_4$ gas.

4. The method of claim 1 wherein the amorphous silicon layer is provided by a $Si_2H_6$ gas.

5. The method of claim 1 wherein the amorphous silicon layer is provided by a $Si_3H_4$ gas.

6. The method of claim 1 wherein the amorphous silicon layer is provided by a sputtering process.

7. The method of claim 1 wherein the inert environment comprises an argon gas.

8. The method of claim 1 wherein the inert environment comprises a nitrogen gas.

9. The method of claim 1 wherein the inert environment comprises a helium gas.

* * * * *